(12) United States Patent
Wei et al.

(10) Patent No.: US 10,079,134 B2
(45) Date of Patent: Sep. 18, 2018

(54) INDUCTIVELY COUPLED PLASMA DEVICE

(71) Applicants: Boe Technology Group Co., Ltd., Beijing (CN); Hefei Xinsheng Optoelectronics Technology Co., Ltd., Anhui (CN)

(72) Inventors: Yu Wei, Beijing (CN); Jun Liu, Beijing (CN)

(73) Assignees: BOE TECHNOLOGY GROUP CO. LTD., Beijing (CN); HEFEI XINSHENG OPTOELECTRONICS TECHNOLOGY CO., LTD., Anhui (CN)

(*) Notice: Subject to any disclaimer, the term of this patent is extended or adjusted under 35 U.S.C. 154(b) by 0 days.

(21) Appl. No.: 15/736,278

(22) PCT Filed: May 25, 2017

(86) PCT No.: PCT/CN2017/085859
§ 371 (c)(1),
(2) Date: Dec. 13, 2017

(87) PCT Pub. No.: WO2017/206786
PCT Pub. Date: Dec. 7, 2017

(65) Prior Publication Data
US 2018/0174799 A1 Jun. 21, 2018

(30) Foreign Application Priority Data

Jun. 1, 2016 (CN) .......................... 2016 1 0383812

(51) Int. Cl.
*H01J 37/32* (2006.01)
(52) U.S. Cl.
CPC ..... *H01J 37/321* (2013.01); *H01J 2237/3344* (2013.01)

(58) Field of Classification Search
CPC ........ H01J 49/105; H01J 37/32; H01J 37/321; H01J 37/3211; H01J 37/32211;
(Continued)

(56) References Cited

U.S. PATENT DOCUMENTS 6,149,760 A    11/2000   Hama
6,331,754 B1 * 12/2001   Satoyoshi ........... H01J 37/3244
                                                                   315/111.51
(Continued)

FOREIGN PATENT DOCUMENTS

CN        101754564 A     6/2010
CN        102595760 A     7/2012
(Continued)

OTHER PUBLICATIONS

Office Action received for Chinese Patent Application No. 201610383812.8, dated Sep. 18, 2017, 20 pages (11 pages of English Translation and 9 pages of Office Action).

(Continued)

*Primary Examiner* — Haissa Philogene
(74) *Attorney, Agent, or Firm* — Womble Bond Dickinson (US) LLP

(57) ABSTRACT

The present disclosure provides an inductively coupled plasma device, comprising a reaction chamber, a dielectric coupling plate, and a coil above the dielectric coupling plate. The dielectric coupling plate comprises at least two layers. The dielectric coupling plate comprises a plurality of regions, each region being provided with an electric field regulating structure, the electric field regulating structure being located between the at least two layers of the dielectric coupling plate. The electric field regulating structure is configured to regulate an intensity of an electric field that enters the reaction chamber through each region of the dielectric coupling plate.

10 Claims, 4 Drawing Sheets

(58) Field of Classification Search
CPC ....... H01J 37/32009; H05H 1/30; H05H 1/32; H05H 1/46; H05H 1/3405; H05H 2001/4652; H05H 2001/466; H05H 2001/4667; H05H 2001/2437; H01L 21/3065

See application file for complete search history.

(56) References Cited

U.S. PATENT DOCUMENTS

| | | | | |
|---|---|---|---|---|
| 8,181,597 | B2 * | 5/2012 | Kim .................. | H01J 37/32082 118/723 I |
| 9,433,073 | B2 * | 8/2016 | Cheung ................. | H05H 1/32 |
| 2006/0225653 | A1 * | 10/2006 | Xu ........................ | H01J 37/321 118/723 E |
| 2011/0241547 | A1 | 10/2011 | Wei | |
| 2013/0000847 | A1 | 1/2013 | Tetsuka et al. | |
| 2013/0299091 | A1 | 11/2013 | Sakka et al. | |

FOREIGN PATENT DOCUMENTS

| | | |
|---|---|---|
| CN | 202873172 U | 4/2013 |
| CN | 203910743 U | 10/2014 |
| CN | 105931940 A | 9/2016 |
| KR | 10-2004-0025094 A | 3/2004 |
| KR | 10-2004-0064920 A | 7/2004 |
| KR | 10-2005-0048421 A | 5/2005 |
| KR | 10-2010-0048326 A | 5/2010 |
| KR | 10-1050443 B1 | 7/2011 |

OTHER PUBLICATIONS

Office Action received for Chinese Patent Application No. 201610383812.8, dated May 3, 2017, 14 pages (7 pages of English Translation and 7 pages of Office Action).

International Search Report received for PCT Patent Application No. PCT/CN2017/085859, dated Sep. 5, 2017, 6 pages (2 pages of English Translation and 4 pages of Original Document).

Office Action received for Chinese Patent Application No. 201610383812.8, dated Feb. 13, 2018, 16 pages (10 pages of English Translation and 6 pages of Office Action).

* cited by examiner

INDUCTIVELY COUPLED PLASMA DEVICE

TECHNICAL FIELD

The present disclosure relates to the field of display technology, particularly, to an inductively coupled plasma device.

BACKGROUND

Inductively coupled plasma (ICP) devices are widely applied in plasma etching processes. The working principle for plasma etching is as follows. The reaction gas is ionized under the excitation of the electric field so as to generate plasma, wherein the plasma contains active particles such as electrons, ions, as well as excited atoms, molecules, and free radicals. These active particles can react with the material layer to be etched, so as to pattern the material layer to be etched.

In inductively coupled plasma devices of the prior art, a non-uniform distribution of the electric field in the reaction chamber may cause plasmas in the reaction to be also in a non-uniform distribution, thereby influencing the uniformity of etching.

SUMMARY

At least one object of the present disclosure is to provide an inductively coupled plasma device that at least improves the uniformity of etching.

According to an aspect of the present disclosure, an inductively coupled plasma device is provided, comprising: a reaction chamber, a dielectric coupling plate, and a coil above the dielectric coupling plate. The dielectric coupling plate comprises at least two layers. The dielectric coupling plate comprises a plurality of regions, each region being provided with an electric field regulating structure, the electric field regulating structure being located between the at least two layers of the dielectric coupling plate. The electric field regulating structure is configured to regulate an intensity of an electric field that enters the reaction chamber through each region of the dielectric coupling plate.

According to an embodiment of the present disclosure, a material for the electric field regulating structure can be a wave-absorbing material. In such a case, the wave-absorbing material can absorb 1%-30% of magnetic field energy generated by the coil.

According to an embodiment of the present disclosure, the wave-absorbing material can be a metal, and the electric field regulating structure can be a grid structure. Alternatively, the wave-absorbing material can be a carbon fiber, and the electric field regulating structure can be a block structure.

According to an embodiment of the present disclosure, the electric field regulating structure can be arranged on a surface of at least one of the at least two layers of the dielectric coupling plate.

According to an embodiment of the present disclosure, at least one of the at least two layers of the dielectric coupling plate can be provided with a groove in which the electric field regulating structure can be arranged.

According to an embodiment of the present disclosure, the plurality of regions of the dielectric coupling plate can be arranged in a matrix.

According to an embodiment of the present disclosure, the plurality of regions of the dielectric coupling plate can comprise a first region located at the center, a second region surrounding the first region, and a third region located at an outer side of the second region. In such a case, the dielectric coupling plate can have a shape of rectangle, the second region can have a peripheral contour of rectangle, and the third region can comprise four first sub-regions and four second sub-regions. Each of the first sub-regions can be adjacent to an edge of the second region respectively. Also, an edge of the first sub-region and an edge of the second region that are adjacent to each other have an equal length. Each of the second sub-regions can be located at a vertex of the dielectric coupling plate respectively.

In the inductively coupled plasma device according to the present disclosure, by dividing the dielectric coupling plate into a plurality of regions and arranging an electric field regulating structure in each region, the electric field that enters the reaction chamber from each region of the dielectric coupling plate can be regulated independently in intensity. This improves the uniformity of intensity in the electric field that enters the reaction chamber through the dielectric coupling plate, thereby improving the uniformity of plasma in the reaction chamber and the uniformity of etching. In addition, arranging the electric field regulating structure between two layers of the dielectric coupling plate can avoid influences on the formation of plasmas in the reaction chamber, and also avoid generation of range with the coil, which may result in abnormal discharge.

BRIEF DESCRIPTION OF THE DRAWINGS

In order to explain the technical solutions in embodiments of the present disclosure more clearly, the drawings that show the embodiments of the present disclosure will be described in the following. It should be recognized that the drawings described below only show some exemplary embodiments of the present disclosure, rather than limitations to the scope of the present disclosure. In the drawings, FIG. 1 schematically shows an inductively coupled plasma device in the prior art.

DETAILED DESCRIPTION OF THE EMBODIMENTS

In the followings, exemplary embodiments of the present disclosure will be described clearly and completely in conjunction with the drawings. However, the embodiments described herein are only exemplary rather than restrictive.

Figure 1:
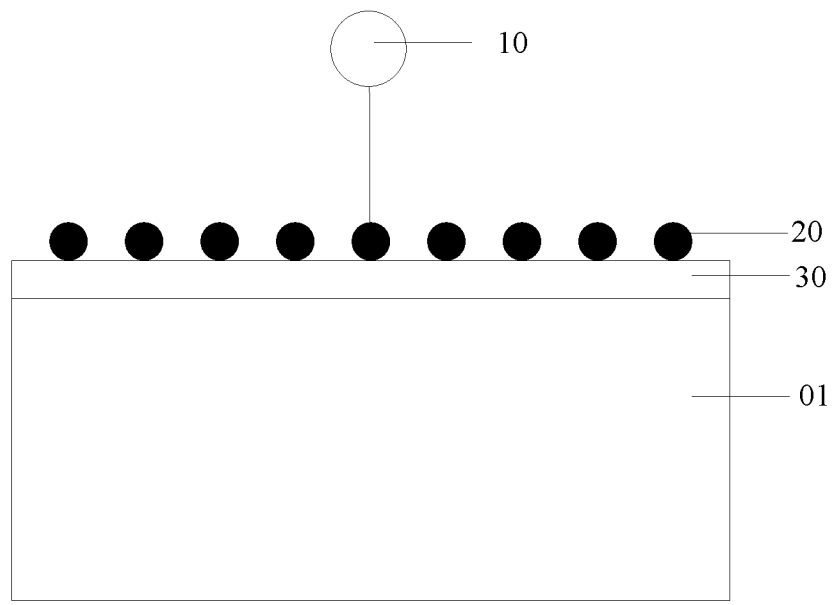

FIG. 1 shows an inductively coupled plasma device in the prior art.

As shown in FIG. 1, the inductively coupled plasma device can comprise a reaction chamber 01 and a dielectric coupling plate 30. The dielectric coupling plate 30 seals the reaction chamber 01. The dielectric coupling plate 30 is provided with an air intake (not shown in FIG. 1), for injecting reaction gas to the reaction chamber 01. A coil 20 is arranged above the dielectric coupling plate 30, and externally connected to a RF source 10. The RF source 10 is used for applying a RF current into the coil 20, so as to generate a changing magnetic field by the coil 20. The changing magnetic field can induce an electric field, thereby ionizing the reaction gas injected into the reaction chamber 01 so as to generate plasma.

However, due to a non-uniform distribution of the electric field in the reaction chamber 01, plasmas in the reaction chamber 01 is also in a non-uniform distribution, thereby influencing the uniformity of etching. For a high generation of production line for panels, the uniformity of etching is particularly important.

Figure 2:
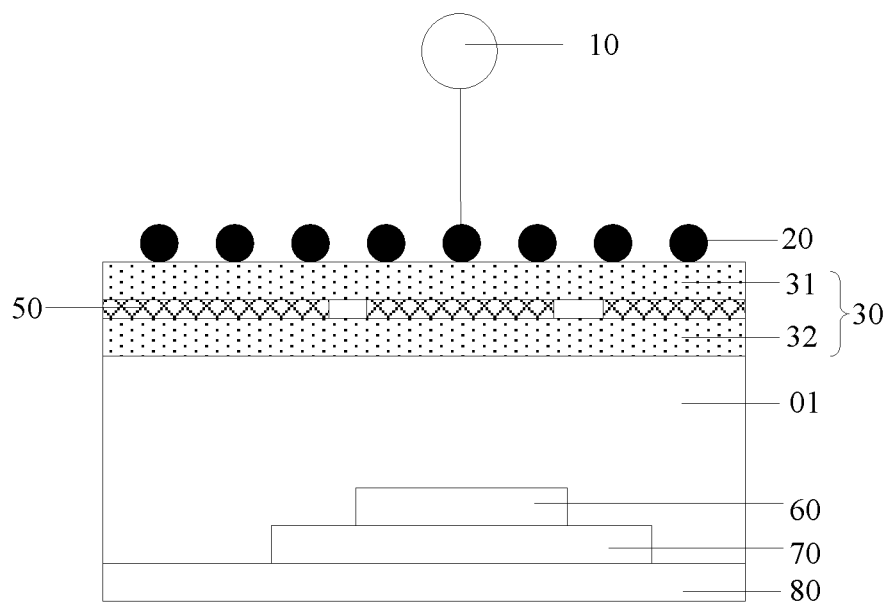
FIG. 2 is a structural schematic view of an inductively coupled plasma device according to an embodiment of the present disclosure.

FIG. 2 is a structural schematic view of an inductively coupled plasma device according to an embodiment of the present disclosure.

As shown in FIG. 2, the inductively coupled plasma device according to an embodiment of the present disclosure can comprise a reaction chamber 01, a dielectric coupling plate 30, and a coil 20 arranged above the dielectric coupling plate 30. The dielectric coupling plate 30 comprises at least two layers 31 and 32. The dielectric coupling plate 30 comprises a plurality of regions, each region being provided with an electric field regulating structure 50. The electric field regulating structure 50 is located between the at least two layers 31 and 32 of the dielectric coupling plate 30. The electric field regulating structure 50 is used for regulating an intensity of an electric field that enters the reaction chamber 01 through each region of the dielectric coupling plate 30.

In addition, the dielectric coupling plate 30 can further comprise at least one air intake (not shown in FIG. 2), for injecting reaction gas to the reaction chamber 01. The coil 20 is connected to a RF source 10 for generating an induced electric field by the coil 20. The reaction chamber 01 can be provided with a base station 80 at bottom, and an electrostatic chuck 70 for fixing a substrate 60 to be etched is arranged on the base station 80. The base station 80 can be provided with a small hole (not shown in FIG. 2), and helium is injected from outside through the small hole, so as to cool the electrostatic chuck 70 and enable the electrostatic chuck 70 to be adsorbed to the base station 80, playing a role of fixing the electrostatic chuck 70.

It should be explained that the concept of the present disclosure does not define connecting manners between the dielectric coupling plate 30 and the reaction chamber 01, as long as the reaction chamber 01 can be sealed. In addition, the concept of the present disclosure does not define numbers and shapes of the coil 20 arranged above the dielectric coupling plate 30, numbers of the coil 20 can be one or more. The coil 20 can be in a polygonal shape comprising several turns, and can also be in a concentrically ringed shape comprising several turns, as long as an induced electric field can be generated. The concept of the present disclosure does not define layer numbers of the dielectric coupling plate 30. Although FIG. 2 shows that the dielectric coupling plate 30 comprises two layers 31 and 32 (i.e., a first layer of dielectric coupling plate 31 and a second layer of dielectric coupling plate 32), the dielectric coupling plate 30 can also comprise more than two layers.

The electric field regulating structure 50 can be arranged on a surface of at least one of the at least two layers 31 and 32 of the dielectric coupling plate 30. For example, the electric field regulating structure 50 can be arranged on a surface of the first layer of the dielectric coupling plate 31 facing the second layer of dielectric coupling plate 32. Alternatively or additionally, the electric field regulating structure 50 can be arranged on a surface of the second layer of the dielectric coupling plate 32 facing the first layer of dielectric coupling plate 31. In case that the electric field regulating structure 50 needs to be replaced, the first layer of dielectric coupling plate 31 can be revealed, so as to replace the electric field regulating structure 50.

According to an embodiment of the present disclosure, the material used for the electric field regulating structure 50 is a wave-absorbing material. In order to improve the etching uniformity while not influencing the rate of etching, the wave-absorbing material for forming the electric field regulating structure 50 can only absorb 1%-30% of the magnetic field energy generated by the coil 20.

Figure 7:
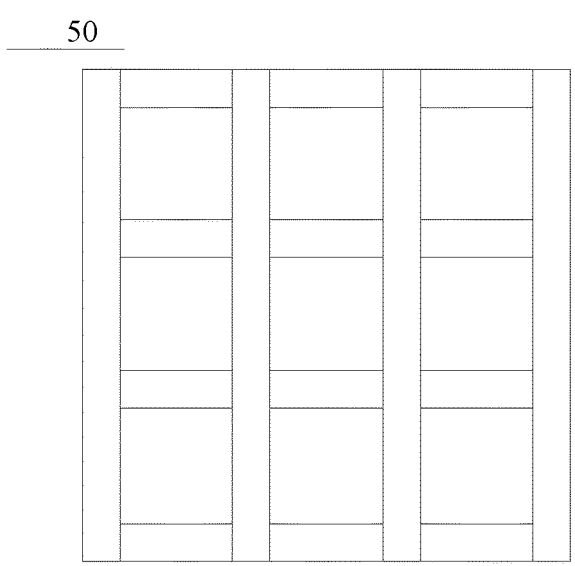
FIG. 7 schematically shows a grid-like electric field regulating structure that can be applied in the inductively coupled plasma device according to an embodiment of the present disclosure.

According to an embodiment of the present disclosure, the wave-absorbing material is a metal, and the electric field regulating structure 50 is a grid structure, as shown in FIG. 7. For example, the wave-absorbing material for forming the electric field regulating structure 50 can be Al, Cu etc. The grid density of the metal grid structure can be set based on different wave-absorbing materials, so as to control the regulating ability of the electric field regulating structure 50 on the electric field.

Alternatively, the wave-absorbing material can be a carbon fiber, and the electric field regulating structure 50 is a block structure. The carbon fiber can be doped with metal, so as to improve the electric field regulating ability of the wave-absorbing material. The metal to be doped can be Al, Cu etc. The block electric field regulating structure 50 can be manufactured more easily than the grid-like electric field regulating structure 50, thus saving manufacturing cost.

According to an embodiment of the present disclosure, the dielectric coupling plate 30 is divided into a plurality of regions, and each region is provided with an electric field regulating structure 50 for regulating the electric field independently. In this way, the electric field that enters the reaction chamber 01 through each region is uniform in intensity. The regulating ability of the electric field regulating structure 50 arranged in different regions can be controlled independently as needed.

When the substrate 60 to be etched is treated, the reaction gas is injected into the reaction chamber 01 through the air intake of the dielectric coupling plate 30. The RF power generated by the RF generator 10 is transmitted to the coil 20. When the magnetic field energy generated by the coil 20 passes through each region of the dielectric coupling plate 30, the electric field regulating structure 50 located in each region regulates the electromagnetic field energy passing through this region to a different degree, i.e., regulating the induced electric field generated by the electromagnetic field energy. In this way, the induced electric field of each region is uniform in intensity, thereby etching the substrate 60 to be etched on the electrostatic chuck 70 uniformly.

By dividing the dielectric coupling plate 30 into a plurality of regions and arranging an electric field regulating structure 50 in each region, the intensity of the electric field that enters the reaction chamber 01 from each region of the dielectric coupling plate 30 can be regulated independently. This improves the uniformity of intensity in the electric field that enters the reaction chamber 01 through the dielectric coupling plate 30, thereby improving the uniformity of plasma in the reaction chamber 01 and the uniformity of etching for the substrate 60 to be etched. In addition, arranging the electric field regulating structure 50 between the first layer of dielectric coupling plate 31 and the second layer of dielectric coupling plate 32 can avoid influences on the formation of plasma in the reaction chamber 01, and also avoid generation of range with the coil 20, which may result in abnormal discharge.

Figure 3:
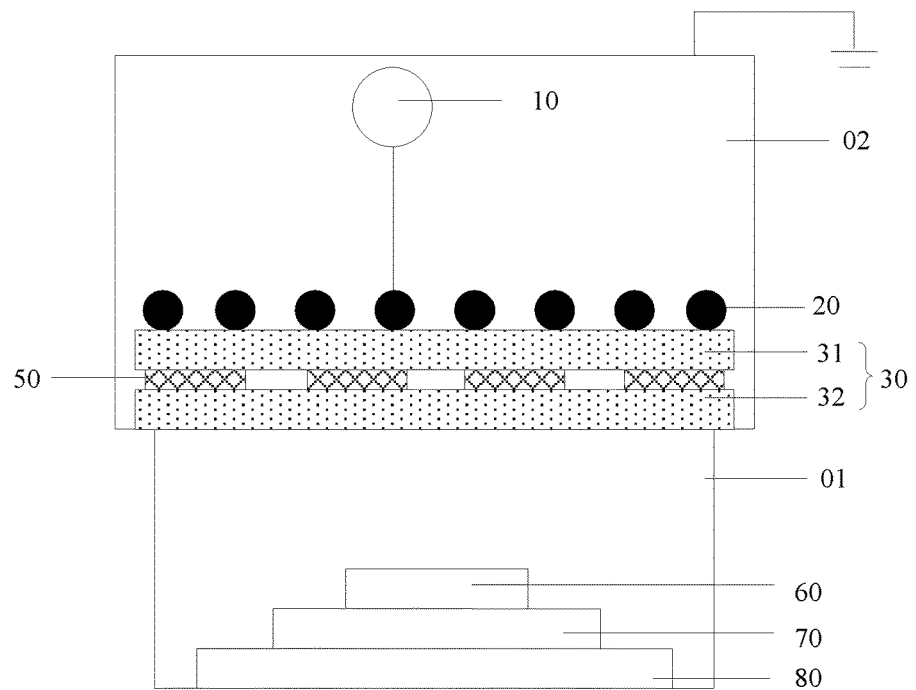
FIG. 3 is a structural schematic view of an inductively coupled plasma device according to another embodiment of the present disclosure.

FIG. 3 is a schematic structural view of an inductively coupled plasma device according to another embodiment of the present disclosure. Next, it will be described in detail with respect to the difference from the preceding embodiment described with reference to FIG. 2, while the same part is omitted.

As shown in FIG. 3, the inductively coupled plasma device according to an embodiment of the present disclosure can comprise a cavity, and the dielectric coupling plate 30 can be arranged within the cavity. The cavity under the dielectric coupling plate 30 forms a reaction chamber 01, and the dielectric coupling plate 30 seals the reaction chamber 01. The dielectric coupling plate 30 can be provided with an air intake (not shown in FIG. 3), wherein the coil 20 is arranged above the dielectric coupling plate 30 and connected to a RF source 10 arranged in an upper chamber 02. In addition, the housing of the cavity is connected to the ground, so as to set the inductively coupled plasma device to be at zero potential. The dielectric coupling plate 30 can comprise a first layer of dielectric coupling plate 31 and the second layer of dielectric coupling plate 32.

Figure 4:
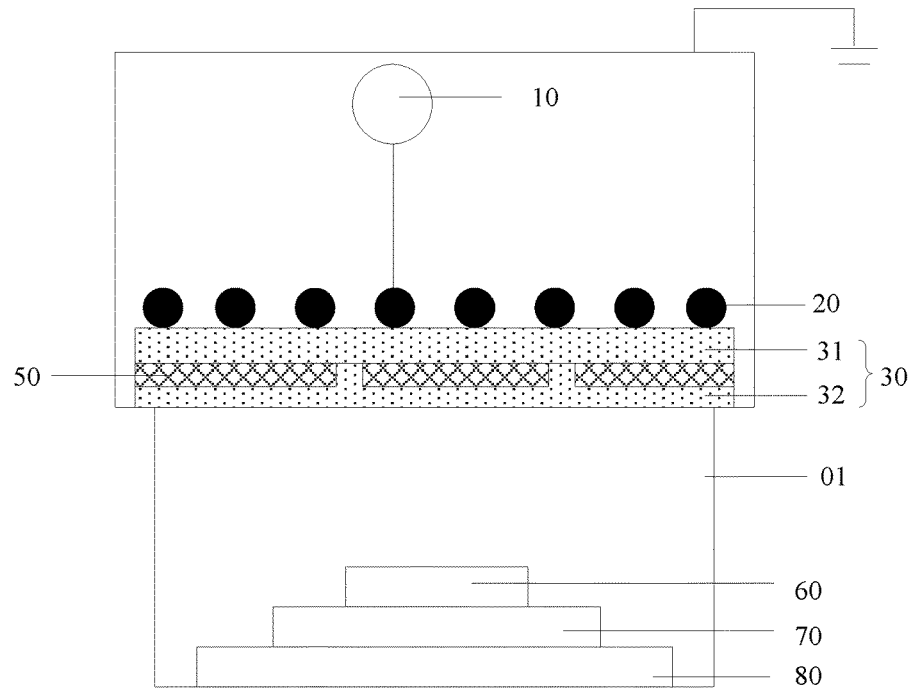
FIG. 4 is a structural schematic view of an inductively coupled plasma device according to a further embodiment of the present disclosure.

FIG. 4 is a schematic structural view of an inductively coupled plasma device according to a further embodiment of the present disclosure. Next, it will be described in detail with respect to the difference from the preceding embodiments described with reference to FIGS. 2 and 3, while the same part is omitted.

According to an embodiment of the present disclosure, a groove can be arranged on a surface of the second layer of dielectric coupling plate 32 facing the first layer of dielectric coupling plate 31, and the electric field regulating structure 50 can be arranged within each groove. Alternatively or additionally, a groove can be arranged on a surface of the first layer of dielectric coupling plate 31 facing the second layer of dielectric coupling plate 32.

Figure 5:
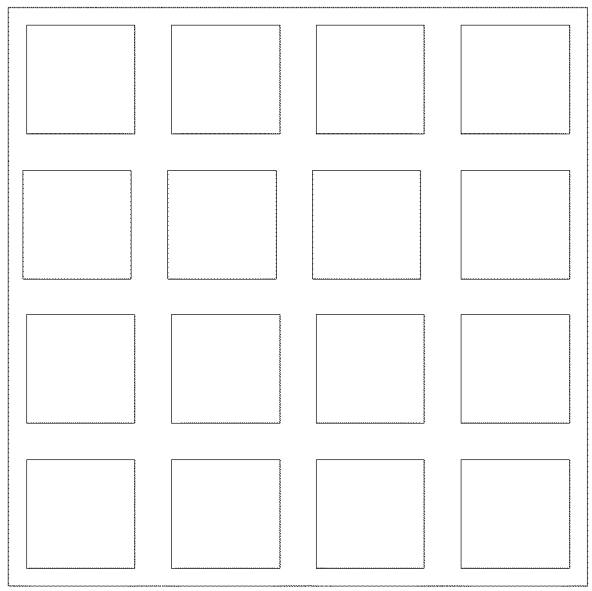
FIG. 5 schematically shows a way for dividing regions of a dielectric coupling plate that can be applied in the inductively coupled plasma device according to an embodiment of the present disclosure.

FIG. 5 schematically shows a way for dividing regions of a dielectric coupling plate that can be applied in the inductively coupled plasma device according to an embodiment of the present disclosure.

As shown in FIG. 5, the dielectric coupling plate 30 comprises a plurality of regions arranged in a 4×4 matrix. However, the present disclosure is not limited to this, and the dielectric coupling plate 30 comprises any plurality of regions arranged in a matrix. The electric field regulating structure 50 can be arranged in each region for regulating an intensity of the electric field that enters the reaction chamber 01 through each region.

Figure 6A:
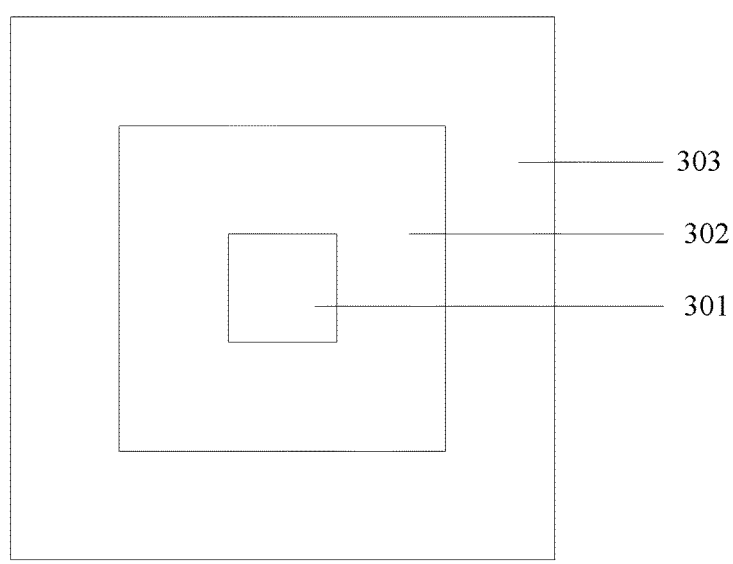
FIGS. 6A and 6B schematically show ways for dividing regions of a dielectric coupling plate that can be applied in the inductively coupled plasma device according to an embodiment of the present disclosure.
Figure 6B:
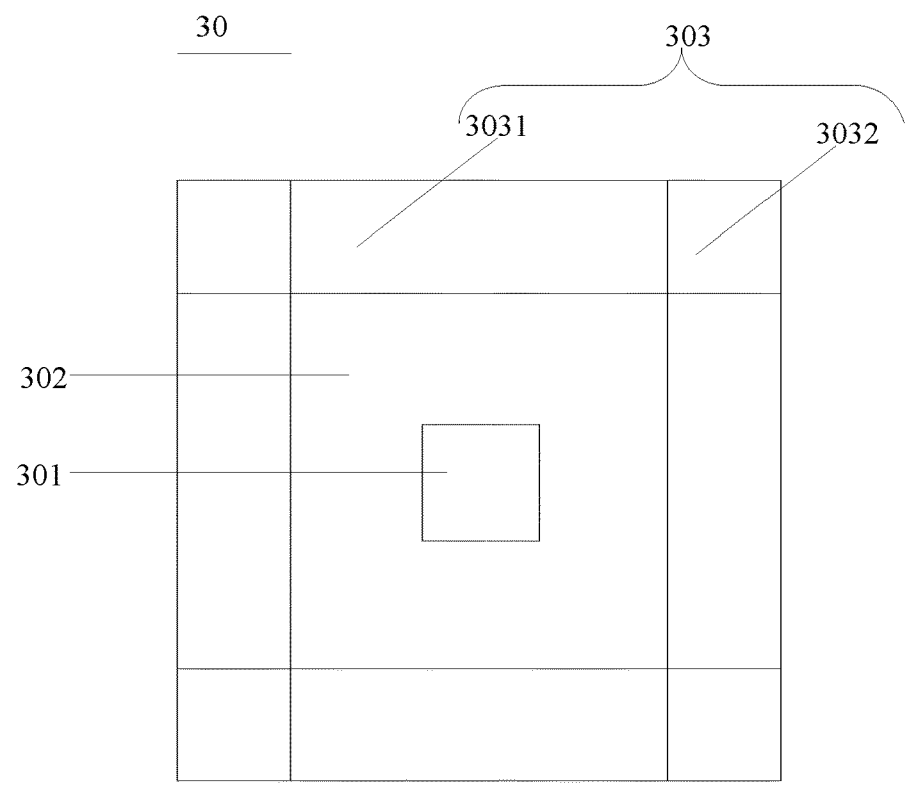

FIGS. 6A and 6B schematically show ways for dividing regions of a dielectric coupling plate that can be applied in the inductively coupled plasma device according to an embodiment of the present disclosure.

As shown in FIG. 6A, the dielectric coupling plate 30 can comprise a first region 301 located at the center, a second region 302 surrounding the first region 301, and a third region 303 located at the outer side of the second region 302.

Because the electric field intensities generated by the coil 20 from the center to the edge of the dielectric coupling plate are different, the way for dividing as shown in FIG. 6A enables the electric field regulating structure 50 located in different regions to regulate electric fields of corresponding regions to different degrees.

As shown in FIG. 6B, the third region 302 can be further divided into a first sub-region 3031 and a second sub-region 3032. As shown in the figure, the dielectric coupling plate 30 has a shape of rectangle, and the second region 302 has a peripheral contour of rectangle. The third region 303 comprises four first sub-regions 3031 and four second sub-regions 3032. Each of the first sub-regions 3031 is adjacent to an edge of the second region 302 respectively, and an edge of the first sub-region 3031 and an edge of the second region 302 that are adjacent to each other have an equal length. Each of the second sub-regions 3032 is located at a vertex of the dielectric coupling plate 30 respectively.

The regulation can be more accurate by further dividing the third region 303 specifically.

What are stated above are only specific implementations of the present disclosure. However, the protection scope of the present disclosure is not limited to this. Any modifications or replacements that can be easily conceived by the skilled person familiar with the present technical field within the technical scope disclosed by the present disclosure should be covered within the protection scope of the present disclosure. Therefore, the protection scope of the present disclosure shall be subject to the protection scopes of the claims.

The invention claimed is:

1. An inductively coupled plasma device, comprising: a reaction chamber, a dielectric coupling plate, and a coil above the dielectric coupling plate, wherein
   the dielectric coupling plate comprises at least two layers,
   the dielectric coupling plate comprises a plurality of regions, each region being provided with an electric field regulating structure, the electric field regulating structure being located between the at least two layers of the dielectric coupling plate, and
   the electric field regulating structure is configured to regulate an intensity of an electric field that enters the reaction chamber through each region of the dielectric coupling plate.

2. The inductively coupled plasma device according to claim 1, wherein a material for the electric field regulating structure is a wave-absorbing material.

3. The inductively coupled plasma device according to claim 2, wherein the wave-absorbing material absorbs 1%-30% of magnetic field energy generated by the coil.

4. The inductively coupled plasma device according to claim 2, wherein the wave-absorbing material is a metal and the electric field regulating structure is a grid structure.

5. The inductively coupled plasma device according to claim 2, wherein the wave-absorbing material is a carbon fiber and the electric field regulating structure is a block structure.

6. The inductively coupled plasma device according to claim 1, wherein the electric field regulating structure is located on a surface of at least one of the at least two layers of the dielectric coupling plate.

7. The inductively coupled plasma device according to claim 1, wherein at least one of the at least two layers of the dielectric coupling plate is provided with a groove in which the electric field regulating structure is located.

8. The inductively coupled plasma device according to claim 1, wherein the plurality of regions of the dielectric coupling plate are arranged in a matrix.

9. The inductively coupled plasma device according to claim 1, wherein the plurality of regions of the dielectric coupling plate comprise a first region at the center, a second region surrounding the first region, and a third region at an outer side of the second region.

10. The inductively coupled plasma device according to claim 9, wherein
    the dielectric coupling plate has a shape of rectangle,
    the second region has a peripheral contour of rectangle, and
    the third region comprises four first sub-regions and four second sub-regions,
    wherein each of the first sub-regions is adjacent to an edge of the second region respectively, an edge of the first sub-region and an edge of the second region that are adjacent to each other have an equal length, and
    wherein each of the second sub-regions is located at a vertex of the dielectric coupling plate respectively.

* * * * *